United States Patent [19]

Langer

[11] Patent Number: 4,927,614
[45] Date of Patent: May 22, 1990

[54] PROCESS FOR GROWING BERLINITE CRYSTALS

[75] Inventor: Horst G. Langer, Wayland, Mass.

[73] Assignee: The Dow Chemical Company, Midland, Mich.

[21] Appl. No.: 157,840

[22] Filed: Feb. 19, 1988

[51] Int. Cl.$^5$ .............................................. C01B 25/36
[52] U.S. Cl. ........................................ 423/305; 423/306
[58] Field of Search ................... 423/311, 305, 308; 156/622, 623 R

[56] References Cited

U.S. PATENT DOCUMENTS

| | | | |
|---|---|---|---|
| 2,363,386 | 11/1944 | Bock | 204/72 |
| 3,402,115 | 9/1968 | Campbell et al. | 204/180 |
| 3,523,068 | 8/1970 | Elsenhauer et al. | 204/72 |
| 4,247,358 | 1/1981 | AuCoin et al. | 156/601 |
| 4,294,808 | 10/1981 | Wasel-Nielen et al. | 423/305 |
| 4,300,979 | 11/1981 | Kolb et al. | 156/623 |
| 4,301,025 | 11/1981 | Brady et al. | 252/389 |
| 4,382,840 | 5/1983 | Chai et al. | 156/623 |
| 4,478,805 | 10/1984 | Langer et al. | 423/311 |
| 4,481,069 | 11/1984 | Chai et al. | 156/623 R |
| 4,542,001 | 9/1985 | Iino et al. | 423/311 |
| 4,578,146 | 3/1986 | Chai et al. | 156/623 R |
| 4,579,622 | 4/1986 | Caporaso et al. | 156/623 R |
| 4,622,310 | 11/1986 | Iacobucci | 423/311 |

FOREIGN PATENT DOCUMENTS 59-195513 11/1984 Japan .
60-235797 11/1985 Japan .................................. 423/311

OTHER PUBLICATIONS

Drafall et al., "The Growth of Berlinite (AlPO$_4$) Single Crystals", Litton Systems Inc., Report #RADC-TR-8-0-73 (1980), pp. 1-62.
Chemical Abstract 95:124192v.
Chemical Abstract 95:142093t.

Primary Examiner—John Doll
Assistant Examiner—R. Bruce Breneman

[57] ABSTRACT

A process for growing crystals of berlinite, comprises the steps of:
  (a) preparing in an organic solvent an organoaluminum phosphate organogel, which organogel is free of OH in an amount sufficient to form species of aluminum hydroxide;
  (b) heating the thus-prepared organoaluminum phosphate organogel in an organic solvent at a temperature sufficient to slowly and continuously remove water from the organoaluminum phosphate organogel and to cause precipitation and growth of berlinite crystals and
  (c) recovering the thus-produced berlinite crystals carried out in the presence of a dopant comprising a Group IVB metal compound.

3 Claims, 1 Drawing Sheet

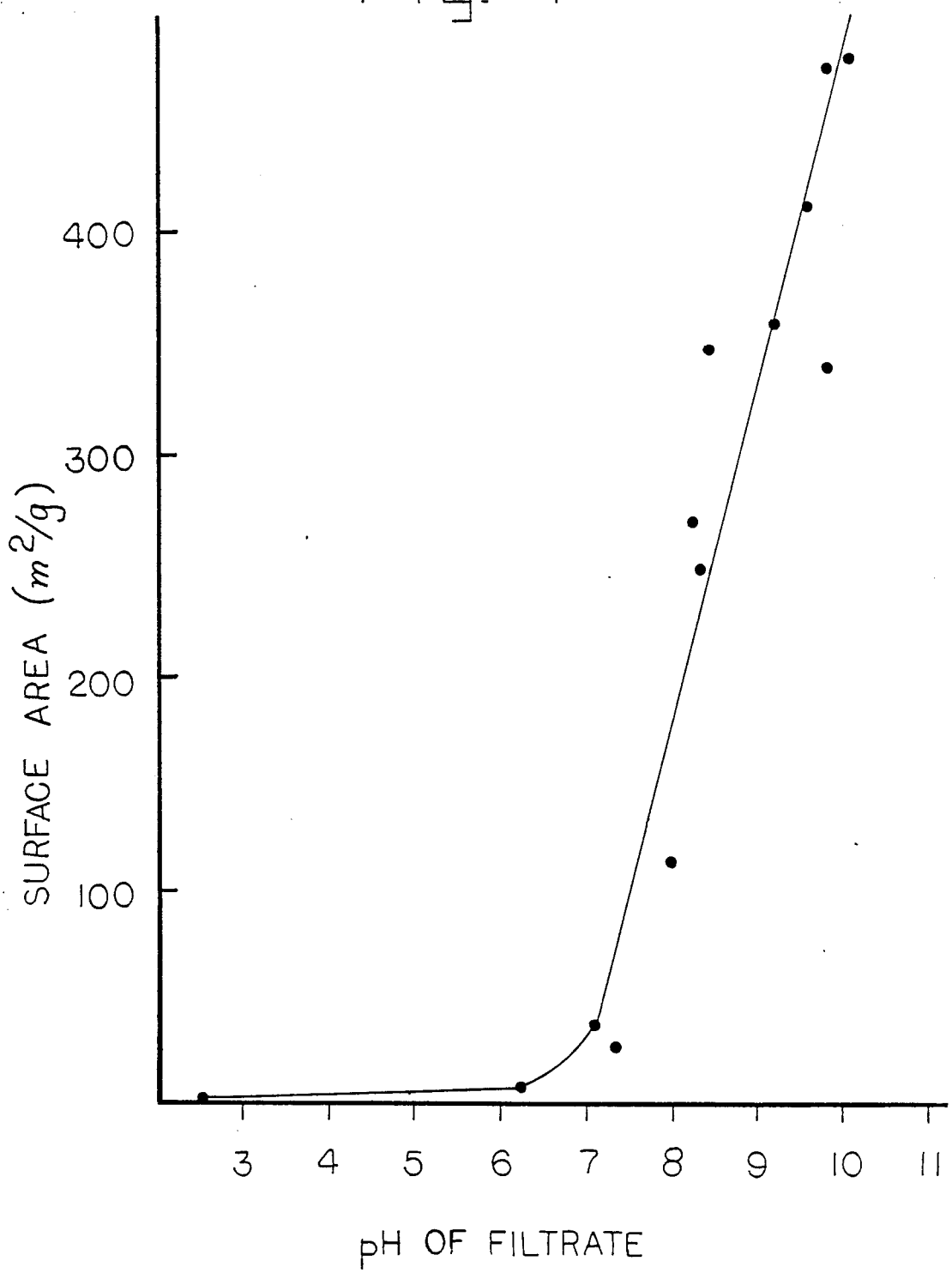

PROCESS FOR GROWING BERLINITE CRYSTALS

TECHNICAL FIELD

Berlinite is anhydrous aluminum phosphate, crystallized in the quartz form. Methods of preparing berlinite are disclosed by Langer et al., in U.S. Pat. No. 4,478,805, herein incorporated by reference.

Berlinite has commercial value dur to its piezoelectric and electronic properties. High purity berlinite can be used as a substitute for quartz in surface acoustic wave piezoelectric devices. For applications of this type, the berlinite cystals must be of very high purity. More particularly, the crystals must be free of iron, sodium and silicon impurities and must be substantially free of water. Water entrapment is a significant problem, associated with the growth of large crystals of berlinite.

Langer et al. '805 disclose the preparation of berlinite using a hydrogel intermediate. This process provides berlinite of the purity required for use in piezoelectric and electronic applications. However, the crystals produced by this process are smaller than required for electronic and piezoelectric applications.

It has been proposed in Japanese Kokai 59/195,513 to purify aluminum orthophosphate by heating in a nonaqueous solvent, for example, xylene.

Iino et al., in U.S. Pat. No. 4,542,001, have recited preparing fine crystalline aluminum orthophosphate by reaction between an aluminum oxide and an aqueous phosphoric acid solution.

The art of aluminum phosphate crystal production accordingly makes readily available only small crystals. Therefore, there is a need for a process for increasing the crystal size of very pure berlinite crystals, without contaminating the crystals with water or objectionable ionic impurities.

SUMMARY OF THE INVENTION

In one aspect, this invention relates to a process for growing crystals of berlinite, comprising the steps of:
(a) preparing in an organic solvent an organoaluminum phosphate organogel, characterized by an OH:Al ratio less than or equal to 2;
(b) heating the thus-prepared organoaluminum phosphate organogel in an organic solvent at a temperature sufficient to slowly and continuously remove water from the organoaluminum phosphate organogel and to cause precipitation and growth of berlinite crystals and
(c) recovering the thus-produced berlinite crystals carried out in the presence of a dopant comprising a Group IVB metal compound.

In a further aspect, this invention relates to a process for growing berlinite crystals comprising at least one cycle of heating feed berlinite crystals in a growth medium and cooling the thus-heated growth medium, wherein the growth medium comprises a partial phosphate ester and a cosolvent selected from an alkoxyalkanol or a dialkyl sulfoxide.

DETAILED DESCRIPTION OF THE INVENTION

In a preferred embodiment, the organoaluminum phosphate organogel can be represented by Formula I

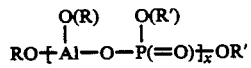

$$RO+Al-O-P(=O)]_x OR'$$

wherein each R and R' is selected from hydrogen, alkyl, dialkylaminoalkyl or alkoxyalkyl of up to ten carbon atoms or a single bond to oxygen atom of another organogel chain, provided that at least some OR is other than OH, and x is at least 3. Organoaluminum phosphate organogels, in which x is fewer than 3, tend to precipitate. The value of 3 for n is accordingly sufficient to preclude significant precipitation of the organoaluminum phosphate organogel.

R and R' therefore include, but are not limited to, methyl, ethyl, isopropyl, n-butyl, sec-butyl, isobutyl, tert-butyl, hexyl, ethoxyethyl, n-butoxyethyl, isobutoxyethyl, propoxyethyl, isopropoxyethyl, butoxypropyl, butoxyisopropyl, dimethylaminoethyl, diethylaminopropyl, dimethylaminoisopropyl, and other combinations, containing up to ten carbon atoms, including various isomeric propyl, butyl, pentyl and hexyl derivatives. Preferred species of organogels are those wherein R and R' are alkoxyalkyl, particularly alkoxyethyl and alkoxypropyl. Most preferred organogels are those in which R and R' are 2-n-butoxyethyl.

It will be understood that the value for x in the formula of the preferred organoaluminum phosphate organogel may be varied over a wide range and that an exact value may not be determinable. The preferred organogel can therefore be defined in terms of its unit formula, Formula II:

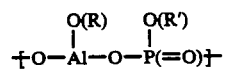

$$+O-Al-O-P(=O)+$$

wherein R and R' are as above.

It has been found that organogels of Formula I, in which n is less than 3, tend to precipitate out of the solvent medium. Accordingly, higher organogel oligomers are preferred. The OH:Al ratio in the organogels is selected so as to avoid precipitation of species of aluminium hydroxide. It has been found that precipitation of aluminum hydroxide species occurs at pH above about 3.4, particularly above 6.7. It is therefore preferred to control the pH of the organogel at values below about 6, most preferably below about 3.4. It will be understood that a maximum OH:Al ratio, at which precipitation is prevented, is about 2. It is preferred to use lower OH:Al ratios, particularly below about 1.30. Most preferably, the OH:Al ratio is below 1.

The organoaluminum phosphate organogel is preferably made by reaction between an aluminum alkoxide of the formula $H_aAl(OR)_{3+a}$, wherein a is 0-1 and R is alkyl, dialkylaminoalkyl or alkoxyalkyl of up to ten carbon atoms; and a partial phosphate ester of the formula

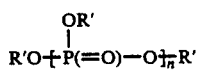

$$R'O+P(=O)-O]_n R'$$

wherein each R' is hydrogen, alkyl, dialkylaminoalkyl or alkoxyalkyl of up to ten carbon atoms; at least one OR' is OH; and n is 1-6, at an aluminum:phosphorus molar ratio of 1:1 to 1:1.2.

The partial phosphate esters therefore range from partial esters of monophosphoric acid through the higher polyphosphoric acids, in which n is 6. Polyphosphoric acids esters in which n is aove 6 are, for the most part, insoluble. However, soluble higher polyphosphate esters can also be used. Most preferably n is 1-3. It will be understood that the partial phosphate esters can include mixtures, both with respect to the number of phosphorus atoms in the chain and with respect to the number of OH functions esterified and that the preferred species recited essentially correspond to average compositions, including mixtures.

Preferred partial phosphate esters are derived from alkoxyalkanols and diphosphoric acid, so that preferred partial phosphate esters are bis(n-alkoxy)alkyl diphosphoric acids. A most preferred partial phosphate ester for making organoaluminum phosphate organogels is bis(2-n-butoxy)ethyl diphosphoric acid.

The partial phosphate esters are, in some cases, commercially available. For example, bis-(2-ethylhexyl)-phosphoric acid is wide used a solvent for extractive purification of phosphoric acid. Other partial phosphate esters can be made as recited by Brady et al., U.S. Pat. No. 4,301,025, herein incorporated by reference.

Aluminum alkoxides preferred for preparing the organoaluminum phosphate organogels are those derived from alkanols or alkoxyalkanols, most particularly those derived from 2-(n-butoxy)ethanol. Aluminum alkoxides of the formula $H_aAl(OR)_{3+a}$ can be made by reaction between aluminum and the selected alcohol, under conditions recited by Langer et al. '805, supra.

In accomplishing growth of berlinite crystals, it is preferred to seed the organoaluminum phosphate organogel with crystals of berlinite. The crystals can be prepared as described by Langer et al. '805. Alternatively, seed crystals, obtained by crystallization of berlinite from phosphoric acid, can be used. The crystallization of berlinite from phosphoric acid is disclosed, for example, by Poignant et al., Chem. Abs. 95: 142093t or Yoshimura et al., Chem. Abs. 95: 124192v.

It has been found that a preferred process for the growth of berlinite crystals is one wherein the organoaluminum phosphate organogel is formed continuously by the slow addition of an aluminum alkoxide and a partial phosphate ester to a reaction mixture, in which the organogel is being prepared and heated.

The organic solvent preferably includes an alkanol or alkoxyalkanol of up to 10 carbon atoms. These correspond to compounds of the formula ROH or R'OH, wherein R and R' are alkyl or alkoxyalkyl of up to 10 carbon atoms. Preferably, the solvent contains an alkoxyalkanol, most preferably an alkoxyethanol. A most preferred solvent contains 2-(n-butoxy)ethanol.

The organic solvent can further be selected from an aromatic or aliphatic hydrocarbon of 6 to 15 carbon atoms. These solvents include hexane, cyclohexane, benzene, toluene, heptane, octane, cumene, xylene, hydrogenated propylene trimer, hydrogenated diisobutylene and other possible isomers of hydrocarbon compounds, having 6 to 15 carbon atoms. Also included are petroleum fractions, such as kerosene, containing these compounds as components of mixtures. Hexane, benzene and toluene are preferred hydrocarbon solvents.

It has been found that the process is particularly effective when the organoaluminum phosphate organogel is formed by reaction between an aluminum alkoxide and a partial phosphate ester in the presence of a water-entraining agent. A water-entraining agent is a material which can remove water from the reaction mixture. The water-entraining agent can be included within the reaction mixture or can be external to the reaction mixture.

Water-entraining agents used within the reaction mixture are typically organic materials, having some solubility in the solvents used. These materials include, but are not limited to, quaternary ammonium salts, quaternary ammonium hydroxides and completely esterified phosphoric and sulfuric acids. The quaternary ammonium salts include tetraalkyl ammonium halides, particularly chlorides, bromides and iodides. Alcohol moieties for esterification of phosphoric and sulfuric acids are selected as above.

A preferred group of water-entraining agents are quaternary ammonium hydroxides, particularly tetraalkyl ammonium hydroxides. Preferred quaternary ammonium hydroxides are those in which alkyl is of 1-4 carbon atoms, including tetramethyl ammonium hydroxide, tetrabutyl ammonium hydroxide, choline and tetraethylammonium hydroxide. Most preferred is tetrapropyl ammonium hydroxide. The quaternary ammonium hydroxides are, in some cases, commercially available. Procedures for the preparation of quaternary ammonium hydroxides are given in U.S. Pat. Nos. 2,363,386; 3,402,115 and 3,523,068, herein incorporated by reference.

The reaction mixture can be treated with a water-entraining agent outside the mixture, for example, by putting the water-entraining agent in the thimble of a Soxhlet extractor, through which the mixture is passed during heating under reflux. Water-entraining agents suitable for removing water in this fashion include calcium chloride, calcium sulfate, molecular sieves and the like.

Another technique for removing water from the organogel is by distillation in the form of an azeotrope. This method is particularly preferred when the solvent is benzene or toluene, either of which readily forms an azeotrope with water.

The temperature at which the process is carried out is normally close to the temperature, at which the solvent system undergoes reflux under ambient pressure. The preferred temperature range is about 80°-120° C. for preferred solvents, including those containing benzene, toluene and xylene. When crystal growth is carried out in the presence of a water-entraining agent in a closed system, higher temperatures will preferably be used, owing to autogenous pressure increases. Temperatures in these systems are preferably 160°-200° C.

In the alternative process of growing berlinite crystals in a growth medium comprising a partial phosphate ester and a cosolvent, it is preferred to use a partial phosphate ester is of the formula

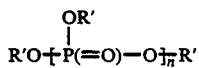

wherein each R' is hydrogen, alkyl, dialkylaminoalkyl or alkoxyalkyl of up to 10 carbon atoms, n is 1-6 and at least one OR' is OH.

When the cosolvent is an alkoxyalkanol, the preferred cosolvent is selected as above. Other cosolvents include, but are not limited to, high dielectric non-aqueous liquids such as dialkylformamides, phosphoramides, sulfoxides, fully esterified phosphoric acids and nitriles. The cosolvents accordingly include hexamethyl phosphoramide, dimethylformamide, acetonitrile, tributyl phosphate, tripropyl phosphate and the like. Sulfoxide cosolvents generally include dialkyl sulfoxides of up to to total of 10 carbon atoms. However, the most preferred cosolvent is dimethylsulfoxide.

The organoaluminum phosphate organogel, from which berlinite crystals are grown must be free of OH in an amount sufficient to form species of aluminum hydroxide. The berlinite seed crystals, formed under the conditions of Langer et al '805, are formed from a hydrogel, in which water is an essential reactant. In this context, excess water is the amount of water, exceeding the essential amount needed to produce aluminim hydroxide species. Because water is an undesirable contaminant in pure berlinite single crystals, any water present in the organogels used in the practice of this invention must be removed. For example, when aqueous phosphoric acid is used, "excess" water produced by formation of pyrophosphate $$2 H_2PO_4 \rightarrow H_4P_2O_7 + H_2O$$

can be removed by azeotropic distillation or entrainment with a scavenger or water-entraining agent.

It has been found that, in utilizing the method of this invention, bipyramidal prisms of berlinite are obtained if the process is carried out in the absence of a dopant. Addition of a dopant, e.g. a Group IVB metal ion, converts the crystalline habit to prismatic. A preferred dopant for the production of prismatic crystals is a titanium compound, most preferably a titanium alkoxide, wherein the alkoxy function is as above. The amount of dopant required to cause formation of prismatic crystals can be determined by routine experimentation.

BRIEF DESCRIPTION OF THE DRAWING

In FIG. 1 is shown the relationship between pH during hydrolysis and surface area of resulting species of aluminophosphate.

BEST MODE FOR CARRYING OUT THE INVENTION

In a most preferred embodiment, the process of this invention is that wherein the organoaluminum phosphate organogel is formed continuously by the slow addition of an aluminum alkoxide and a partial phosphate ester to a reaction mixture, in which the organogel is being prepared and heated; the organic solvent includes an alkanol or alkoxyalkanol of up to 10 carbon atoms and the organogel is formed in the presence of a water-entraining agent.

SPECIFIC EMBODIMENTS

Without further elaboration it is believed that one skilled in the art can, using the preceding description, utilize the present invention to its fullest extent. The following preferred specific embodiments are, therefore, to be construed as merely illustrative and not limitative of the disclosure in any way whatsoever.

In the following examples, temperatures are set forth in uncorrected in degrees Celsius. Unless otherwise indicated, all parts and percentages are by weight.

In the examples, n-butoxyethanol is dried over activated 4 Å molecular sieves and used without further purification. Reagent grade phosphoric acid is used. Aluminum of 99.999999% purity is used for the preparation of aluminum alkoxide.

Reactions under reflux are carried out in three-necked flasks equipped with a nitrogen inlet and a mechanical stirrer. Pressure reactions are carried out in Fischer-Porter bottles with a standard head coupler, connected to a manifold containing a pressure gauge, exhaust valve and pressure release valve set to 6.8 atm.

Example 1

Preparation of Aluminum Alkoxide

Three 10-g Al ingots (1.11 moles) are put in the thimble of a Soxhlet extractor. Dry 2-n-butoxyethanol (527.5 g, 4.44 moles) is placed in a one-liter three-necked flask. About 1 mL of previously prepared tetraalkoxide, HAl(OC$_2$H$_4$OC$_4$H$_9$-n)$_4$, is dropped on the ingots. The system is purged with nitrogen for 16 h. 2-n-Butoxyethanol is heated slowly to cause the alcohol to contact the Al metal in the thimble. After the reaction is initiated, as indicated by pitting of the surface of the Al ingots, the rate of heating is increased to cause gentle refluxing. At the end of 6 h, all the Al is consumed. The product, HAl(OC$_2$H$_4$OC$_4$H$_9$-n)$_4$, is transferred to polyethylene containers for storage.

Other aluminum alkoxides of the formula H$_a$Al(OR)$_{3+a}$ are made in a similar fashion.

Example 2

Bis-(2-n-butoxyethyl) Diphosphoric Acid

To a reaction flask containing 500 ml of methylene chloride under a nitrogen atmosphere is added with stirring phosphorus pentoxide (270 g, 1.9 moles). 2-Butoxyethanol (425 g, 3.6 moles) is added from a dropping funnel over about 2 hr, during which a gentle reflux occurs. At the end of the addition, only a small amount of unreacted P$_2$O$_5$ remains. The contents of the flask are a clear yellow solution. At the end of 24 h additional reaction, the contents of the flask are darker in color and no P$_2$O$_5$ is observed.

$^{31}$P NMR analysis indicates that the product is more than 90% of diphosphoric acid half ester, containing minor amounts of other partial esters of polyphosphoric acids, monophosphates and completely-esterified contaminants.

Example 3

Formation of Organoaluminum Phosphate Organogel and Isolation of Berlinite Crystals To a solution of 42 g of H$_{0.38}$Al(OC$_2$H$_4$OBu-n)$_{3.38}$ in 50 mL of toluene in a 250 mL three-neck flask, equipped with a Dean-Stark trap, reflux condenser, and dropping funnel, are added a few very small seed crystals of berlinite, obtained by the method of U.S. Pat. No. 4,478,805. The contents of the flask are continuously swept with a stream of dry nitrogen and heated under reflux while a solution of 13.3 g of 85% phosphoric acid, 20 g of bis(2-n-butoxyethyl)phosphoric acid and 9 mL of n-butoxyethanol in 33 mL of toluene is added at the rate of about 3 drops/day. It is believed that the combination of alkanol and partial polyphosphate ester solubilizes the phosphoric acid. Addition of a drop of the phosphate solution causes the alkoxide solution to become cloudy. After about half of the phosphate solution is added, a thick gel is formed. The gel dissolves after addition of more phosphate solution. At the end of the addition, berlinite crystals are isolated by diluting the mixture with water and removing the resulting crystals by filtration. The resulting crystals are considerably larger than the seed crystals.

EXAMPLE 4

Growth of Berlinite Crystals in an Organoaluminum Phosphate Organogel

In a three-necked flask is placed 20 g of HAl(OR)$_4$, 125 mL of hexane and 40 mL of ROH, wherein R is n-butoxyethyl. To an addition funnel is charged 5 g of bis(2-n-butoxyethyl)diphosphoric acid, 2.5 g of 2-n-butoxyethanol, 50 mL of hexane and 7 g of 85% phosphoric acid. After addition of a few seed crystals, the mixture is heated under reflux while the phosphoric-phosphate solution is added slowly and dropwise over several days. After the first portions of phosphoric-phosphate solution are added, the mixture in the flask forms a gel, which does not redissolve upon adding 20 mL of n-butoxyethanol. The gel redissolves after about 75% of the phosphoric-phosphate mixture is added, about 6 days later. Crystal growth is apparent after about one month.

Example 5

Growth of Berlinite Crystals in Medium Containing Partial Phosphate Ester and Aluminum Alkoxide In a round-bottom flask is placed 3.5 g of 85% phosphoric acid, 5 g of bis(2-n-butoxyethyl)diphosphoric acid, 18.9 g of hydrogen aluminum tetra(n-butoxyethoxide) and 50 mL of hexane, as well as a few seed crystals of berlinite. The mixture in the flask is heated under reflux to permit crystal growth to occur.

Example 6

Berlinite Crystal Growth in the Presence of a Water-entraining Agent

To 20 g of toluene are added successively 5.76 g of 85% phosphoric acid, 18.9 g of hydrogen aluminum tetra(n-butoxyethoxide) and 12.54 g of 40% aqueous tetrapropyl ammonium hydroxide. The resulting two-phased mixture is transferred to an autoclave and heated to 180° C. for six days to bring about growth of berlinite crystals.

Example 7

Growth of Berlinite Crystals in the Presence of a Water-entraining Agent

An experiment is done, otherwise as in Example 6, except that the mixture is heated under reflux to remove water before transferring the mixture to an autoclave. Toluene codistilled with the water is replaced and the mixture in the autoclave is heated as in Example 6.

Crystals obtained in Examples 2-7 are bipyramidal, apparently because no metal other than Al is present in substantial amounts.

Example 8

Cocrystallization of Berlinite with Titanium Phosphate

To 25 g of toluene are added 15 g of aluminum tris(n-butoxyethoxide), 11.3 g of titanium tetraisopropoxide, 10.8 g of 85% phosphoric acid and 40.6 g of 40% aqueous tetrapropyl ammonium hydroxide. The mixture is transferred to an autoclave and heated at 180° C. under autogenous pressure for 10 days to permit crystal growth to occur. The resulting crystals are prisms.

This experiment shows that use of a Group IVB metal dopant converts the crystalline habit of berlinite to prismatic.

Example 9

Crystal Growth in a Monophosphoric Acid Partial Ester (a) To a warm sample of mono(n-butoxyethyl)phosphoric acid is added enough toluene to barely avoid phase separation. The resulting mixture is heated at 80°-120° C. and powdered berlinite is added until the solution appears to be saturated. Any toluene lost during this process is replaced. Crystal growth occurs as a result of cyclical heating and cooling of the mixture.

(b) The experiment is otherwise as in Example 9(a), except that addition of an aluminum alkoxide, e.g. aluminum tris(n-butoxyethoxide) increases the rate of crystal growth. Addition of a glycol ether, e.g., n-butoxyethanol suffices to counteract any resulting increase in viscosity.

(c) In an experiment, otherwise as in Example 9(b), aluminum alkyl phosphate is added to the mixture. The addition of this material enhances the rate of crystal growth.

Example 10

Determination of Parameters Affecting Gel Structure

Gel is prepared as above, by reaction between HAl(OCH$_2$CH$_2$OBu-n)$_4$ and bis(n-butoxyethyl)diphosphoric acid (EB$_2$P$_2$) in toluene. The alkoxide is added slowly to a stirred solution of EB$_2$P$_2$. The resulting reaction can be represented by the equation:

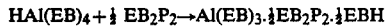

After half the theoretical amount of aluminum alkoxide is added, a gel is formed. The gel becomes homogeneous after the remainder of the aluminum alkoxide is added.

The gel is characterized by $^{31}P[^{1}H]$ NMR spectroscopy, which indicates that all of the starting materials reacted. Only broad, featureless resonances are observed in the monophosphate (about 0 to about 3 ppm) and diphosphate (about 15 ppm) regimes. It is proposed that the observed line broadening is attributable to large numbers of species in the resulting polymer network, coupled to $^{27}Al(100\%, I=5/2)$.

Solvent is removed from the gel in vacuo to leave a highly viscous oil, having the empirical composition Al(EB)$_3$½EB$_2$P$_2$½EBH, which gels immediately upon exposure to moist air. Derivative thermogravimetric analysis produces weight loss in four temperatures ranges, 125°, 220°, 290° and 315° C. The weight loss at 125° C. is attributed to free alcohol (EBH) in view of mass spectrometric data.

Treatment of the gel with excess water at ambient temperatures gives a partially-hydrolyzed solid product and produces about 3 moles of HEB. The hydrolyzed gel is identified as [Al(OH)$_2$PO$_3$EB.½EB]. Weight loss upon pyrolysis occurs at 220° and 305° C. Mass spectrometric data indicates the absence of aluminum alkoxide. The weight loss at 220° C. is characteristic of decomposition of a normal phosphate ester, which decomposes to butyl vinyl ether and its oligomers; the weight loss at 305° C. is attributed to pyrolysis of the sample. Low temperature weight loss is caused by decomposition or acid hydrolysis of phosphate monoesters and high temperature weight loss is caused by pyrolysis of phosphate diester. These data support the following empirical formula for the gel:

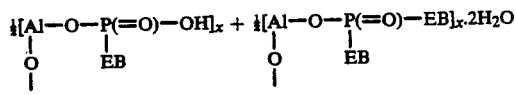

Hydrolysis of 200 g of gel with water produces 2.5 g of a white, water-soluble residue, identified are more than 90% of PO(OH)(EB)$_2$ by $^{31}$P[$^1$H] NMR.

Example 11

Determination of Effect of OH:Al Ratios on Products, Isolated from Hydrolysis of Organogels Organogels made as above are hydrolyzed using aqueous ammonia solutions. Surface area of the berlinite obtained by hydrolysis is determined before and after calcination. Results are given in Table 1. These results show that, at pH values above about 3.4, particularly above 6.7, Al:P ratios increase markedly, owing to the onset of hydrolysis and loss of aluminum in the form of hydroxo species, which give high Al:P ratios. Products with high Al:P ratios undergo relatively little change in surface area as a result of calcination. This behavior is consistent with the presence of large amounts of hydroxylated aluminum species.

A plot of the surface area of hydrolysis products, as a function of pH of the filtrate from hydrolysis is presented as FIG. 1. The observed break in the curve near pH 6 indicates the onset of hydrolysis of aluminum and loss of aluminum from the organogel as hydroxo species.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the inention to adapt it to various usages and conditions.

TABLE 1

Effect of Ammonia Concentration on Surface Area, Calcined Surface Area, pH and Al:P Ratio of Organoalumunim Phosphate Organogels

| Ammonia (N) | Surface Area (m$^2$/g) Before Calcination | Surface Area (m$^2$/g) After Calcination | pH | Al:P Ratio |
|---|---|---|---|---|
| 0 | 0.8 | 47 | 3.4 | 1 |
| 0.1 | 1.9 | — | 6.7 | 1.43 |
| 0.15 | 6.1 | — | 7.1 | 1.67 |
| 0.22 | 35.2 | — | 7.98 | 2.18 |
| 0.25 | 24.8 | 162 | 8.25 | 2.30 |
| 0.35 | 109 | — | 8.9 | 3.13 |
| 0.43 | 262 | — | 9.2 | 3.31 |
| 0.46 | 240 | — | 9.28 | 3.54 |
| 0.50 | 340 | 424 | 9.44 | 3.78 |
|  | 280 |  |  | 5.0 |
| 1.0 | 388 | 406 | — | 5.5 |
| 2.0 | 370 | 449 | 10.2 | 6.6 |
| 3.0 | 401 | 312 | — | 7.2 |
| 4.5 | 403 | 301 | 10.6 | 7.2 |
| 6.0 | 352 | 324 | 10.8 | 6.7 |
| 9.0 | 466 | 370 | 10.85 | 7.3 |
| 12 | 504 | 400 | 11.05 | 6.5 |
| 14 | 469 | 433 | 11.10 | 7.0 |
| 15 | 355 | 345 | 11.10 | 6.2 |

I claim:
1. A process for growing crystals of berlinite, comprising the steps of:
 (a) preparing in an organic solvent an organoaluminum phosphate organogel, characterized by an OH:Al ratio less than or equal to 2;
 (b) heating the thus-prepared organoaluminum phosphate organogel in an organic solvent at a temperature sufficient to slowly and continuously remove water from the organoaluminum phosphate organogel and to cause precipitation and growth of berlinite crystals and
 (c) recovering the thus-produced berlinite crystals, carried out in the presence of a dopant comprising a Group IVB metal compound.
2. The process of claim 1, wherein the dopant is a titanium alkoxide.
3. A process for growing crystals of berlinite, comprising the steps of:
 (a) preparing in an organic solvent an organoaluminum phosphate organogel, characterized by an OH:Al ratio less than or equal to 2;
 (b) heating the thus-prepared organoaluminum phosphate organogel in in an organic solvent at a temperature sufficient to slowly and continuously remove water from the organoaluminum phosphate organogel and to cause precipitation and growth of berlinite crystals and
 (c) recovering the thus-produced berlinite crystals, carried out in the presence of a titanium alkoxide dopant, to produce prismatic crystals of berlinit.

* * * * *

UNITED STATES PATENT AND TRADEMARK OFFICE
CERTIFICATE OF CORRECTION

PATENT NO. : 4,927,614
DATED : May 22, 1990
INVENTOR(S) : Horst G. Langer

It is certified that error appears in the above-identified patent and that said Letters Patent is hereby corrected as shown below:

Column 1, line 9, "dur" should correctly read -- due -- .

Column 2, line 8, "to oxygen" should correctly read -- to an oxygen -- .

Column 2, line 16, "ethyl,isopropyl," should correctly read -- ethyl, isopropyl, -- .

Column 5, line 21, in the formula, "$2H_2PO_4 \quad H_4P_2O_7+H_2O$" should correctly read -- $2H_3PO_4 \quad H_4P_2O_7+H_2O$ -- .

Column 9, line 14, "are" should correctly read -- as -- .

Column 9, line 55, "inention" should correctly read -- invention--.

Signed and Sealed this

Thirty-first Day of December, 1991

Attest:

HARRY F. MANBECK, JR.

*Attesting Officer*  *Commissioner of Patents and Trademarks*